United States Patent [19]

Sato et al.

[11] Patent Number: 4,757,354
[45] Date of Patent: Jul. 12, 1988

[54] PROJECTION OPTICAL SYSTEM

[75] Inventors: Takeo Sato, Kawasaki; Nobuhiro Araki, Yokohama; Koichi Kawata, Tokyo; Noboru Nomura, Kyoto; Atsushi Ueno, Osaka; Shotaro Yoshida, Sendai, all of Japan

[73] Assignee: Matsushita Electrical Industrial Co., Ltd., Osaka, Japan

[21] Appl. No.: 43,620

[22] Filed: Apr. 28, 1987

[30] Foreign Application Priority Data

May 2, 1986 [JP] Japan .................................. 61-102336
Jul. 7, 1986 [JP] Japan .................................. 61-159050

[51] Int. Cl.$^4$ ........................ G03B 27/42; G02B 17/00
[52] U.S. Cl. ........................................ 355/53; 350/442; 355/63
[58] Field of Search ............... 355/53, 63; 350/442, 350/443

[56] References Cited

U.S. PATENT DOCUMENTS

| 2,520,633 | 8/1950 | Grey ........................... 350/442 |
| 4,422,754 | 12/1983 | Isohata et al. ............ 355/53 |
| 4,600,265 | 7/1986 | Norrie ........................ 350/443 |

FOREIGN PATENT DOCUMENTS

| 28-5735 | 11/1953 | Japan . |
| 55-17196 | 2/1980 | Japan . |
| 55-10883 | 3/1980 | Japan . |
| 57-12966 | 3/1982 | Japan . |
| 618253 | 2/1949 | United Kingdom ................ 350/442 |

Primary Examiner—Monroe H. Hayes
Attorney, Agent, or Firm—Lowe, Price, Le Blanc, Becker & Shur

[57] ABSTRACT

A projection optical system for photolithography includes a refraction sub-system and a cata-dioptric sub-system optically connected to each other. The refraction sub-system extends at an object side. The cata-dioptric sub-system extends at an image side. The refraction sub-system is generally composed of refracting members. The cata-dioptric sub-system is generally composed of a phase compensating member, a concave mirror, and a convex mirror. The phase compensating member adjoins the refraction sub-system. At least the concave mirror has a central opening through which light passes. The light forms an image at a rear of the concave mirror.

7 Claims, 7 Drawing Sheets

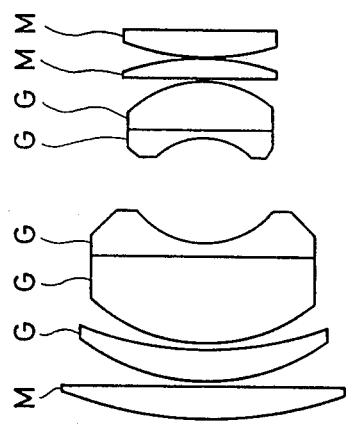
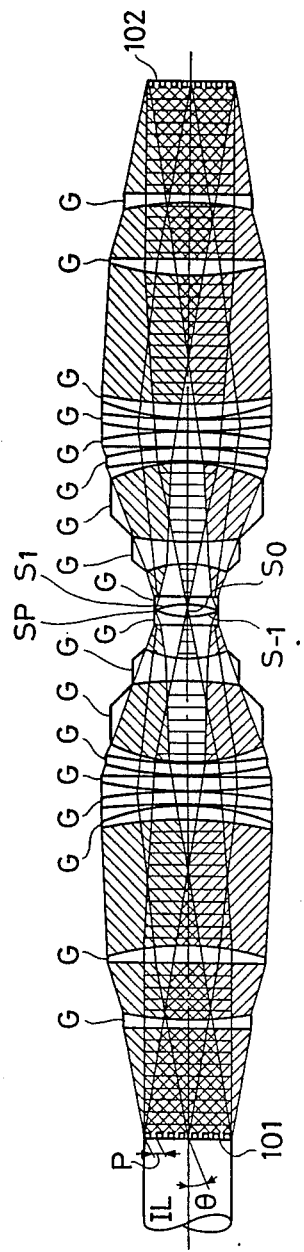
FIG. 1
PRIOR ART
FIG. 2
PRIOR ART

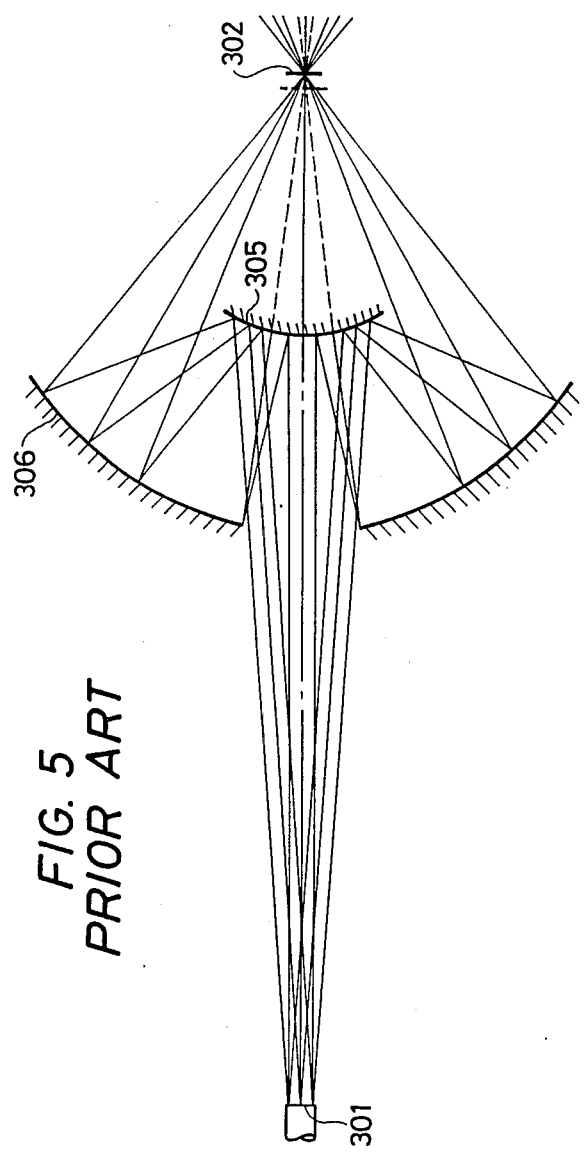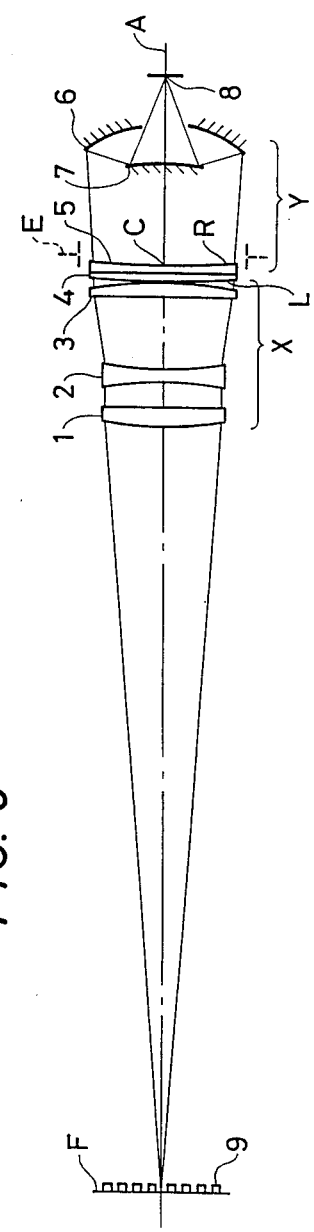
FIG. 5 PRIOR ART
FIG. 6

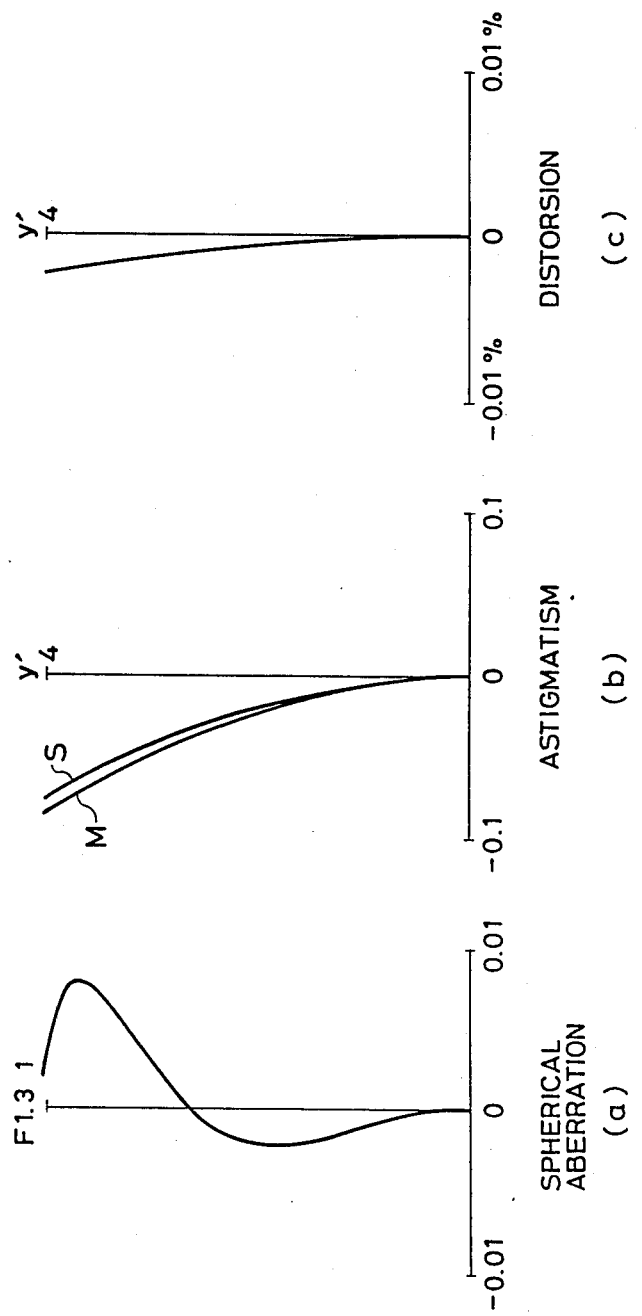

PROJECTION OPTICAL SYSTEM

BACKGROUND OF THE INVENTION

1. Field of the Invention

This invention generally relates to a projection optical system, and specifically relates to a projection optical system for photolithography used in producing integrated circuits, large-scale integrated circuits, or the like.

2. Description of the Prior Art

Conventional projection optical systems are of the refraction type and the reflection type. Japanese published examined patent application No. 57-12966 and Japanese published examined patent application No. 55-10883 disclose projection optical systems of the refraction type. Japanese published unexamined patent application No. 55-17196 and Japanese published examined patent application No. 28-5735 disclose projection optical systems of the reflection type. The conventional projection optical systems are unsatisfactory in a few points as described hereinafter.

SUMMARY OF THE INVENTION

It is a first object of this invention to provide a satisfactory projection optical system.

It is a second object of this invention to provide a projection optical system which can be used with ultraviolet or deep-ultraviolet rays and which enables a high resolution.

It is a third object of this invention to provide a projection optical system which reduces or prevents various aberrations, such as spherical aberration, coma, astigmatism, and distortion.

It is a fourth object of this invention to provide a projection optical system which can be applied to a fine pattern.

In a projection optical system according to this invention, a refraction sub-system includes a plurality of refracting members. A cata-dioptric sub-system includes a phase compensating member, a convex mirror, and a concave mirror arranged in rotation symmetry about a reference axis. The concave mirror has a central opening. The refraction sub-system and the cata-dioptric sub-system extend at an subject side and an image side of the phase compensating member respectively. The refraction sub-system and the cata-dioptric sub-system have a common axis and a common entrance pupil on the common axis. A rear principal point of the refraction sub-system essentially coincides with a front pricipal point of the cata-dioptric sub-system. Lights moved from the object pass through the refraction sub-system while undergoing refraction. Then, the lights enter the cata-dioptric sub-system and pass through the phase compensating member. After the lights pass through the phase compensating member, at least part of bundles of the lights are reflected toward the phase compensating member by the concave mirror and are reflected away from the phase compensating member by the convex mirror. Then, the lights pass through the opening of the concave mirror and form an image on a plane extending perpendicular to the reference axis and rearward of the concave mirror.

In the projection optical system of this invention, it is preferable that all bundles of the lights reflected toward the phase compensating member by the concave mirror are reflected by the convex mirror away from the phase compensating member and then pass through the opening of the concave mirror before forming an image in the rear of the concave mirror.

In the projection optical system of this invention, the convex mirror may have an opening. In this case, it is preferable that part of bundles of the lights which passed through the phase compensating member pass through the openings of the convex mirror and the concave mirror and travel to the image point, and that the remaining bundles are reflected by the concave mirror and the convex mirror and pass through the opening of the concave mirror before traveling to the image point. In this case, it is also preferable that the object to be projected is placed at an object side focal surface of the refraction sub-system and that the light source illuminates the object in such a manner as to concentrate the illumination light bundles on the center of the curvature of the phase compensating member.

BRIEF DESCRIPTION OF THE DRAWINGS

FIG. 1 is a sectional view of a first conventional projection optical system.

FIG. 2 is a sectional view of a second conventional projection optical system.

FIG. 5 is a sectional view of an objective in a conventional reflecting microscope.

FIG. 6 is a sectional view of a projection optical system according to a first embodiment of this invention.

FIG. 8($a$) is a diagram of spherical aberration in the projection optical system of FIGS. 6 and 7.

FIG. 8($b$) is a diagram of astigmatism in the projection optical system of FIGS. 6 and 7.

FIG. 8($c$) is a diagram of distortion in the projection optical system of FIGS. 6 and 7.

DESCRIPTION OF THE PREFERRED EMBODIMENTS

Figure 3:
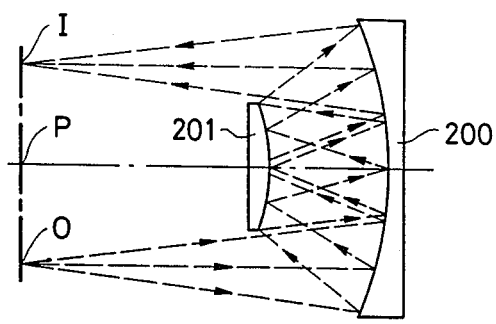
FIG. 3 is a sectional view of a third conventional projection optical system.

Before embodiments of this invention will be described, conventional optical systems will be described in the following for a better understanding of this invention.

FIG. 1 shows a first conventional projection optical system of the pure refraction type, which includes a plurality of lenses made of optical glasses G and crystal optical materials M. The projection optical system of FIG. 1 generally produces a reduced image with a magnification of one-tenth (1/10). In such a conventional optical system, even when the lenses G are made of glass "UBK7" produced by SCHOTT GLASWERKE in the German Federal Republic and designed for application to ultraviolet rays and when the thickness of the glass is 5 mm, the transmittance is 23% at a light wavelength of 280 nm. This transmittance is too small to design an optical system.

FIG. 2 shows a second conventional projection optical system of the refraction type, which includes a plurality of lenses G. In the optical system of FIG. 2, an object or pattern 101 to be projected is illuminated by a bundle of parallel rays IL of partially coherent quasi-monochromatic light. This projection optical system is of the re-diffraction type in which diffracted light from a projected object forms point spectrums $S_1$, $S_0$, and $S_{-1}$ at a pupil surface and then forms again a spreading bundle of rays. The spectrums $S_1$, $S_0$, and $S_{-1}$ correspond to respective orders of diffraction. The spreading bundle of rays passes through the lenses G, and then forms an image by a combination of 0-order diffracted light, +1-order diffracted light, and −1-order diffracted light at an image surface. In FIG. 2, the areas including vertical lines represents 0-order diffracted light, and the areas including inclined lines sloping upward in the direction toward the right and the areas including inclined lines sloping downward in the direction toward the right denote +1-order diffracted light and −1-order diffracted light respectively. An angle $\theta$ of diffraction is given by the following equation.

$$\sin\theta = \lambda \cdot u$$

where the letter u represents the spatial frequency of an object to be projected which equals the reciprocal of the pattern pitch, and the character $\lambda$ represents the wavelength of light emitted from a source.

In the optical system of FIG. 2, respective diffracted lights from the object or pattern 101 separate at a stop or diaphragm SP into point spectrums, passing through the succeeding lenses and then forming again a bundle of parallel rays. The parallel rays combine at a image surface 102, forming a projected pattern by interference fringes.

In general, the resolution limit of a projection optical system is given by the following Rayleigh's equation.

$$D = 0.61 \lambda / NA$$

where the character NA represents the numerical aperture of the image side of the optical system, and the character $\lambda$ denotes the wavelength of the used light.

It is understood from the Rayleigh's equation that an improvement of the resolution limit D is realized by decreasing the light wavelength $\lambda$ or by increasing the numerical aperture NA of the optical system. Since an increase in the numerical aperture NA generally makes the optical designs of lenses difficult, the recent principal way of improving the resolution limit D is to decrease the light wavelength $\lambda$.

In the optical system of FIG. 2, when the wavelength $\lambda$ of the used light is decreased to an ultraviolet range, the transmittance drops excessively. For example, even when the lenses G are made of glass "UBK7" produced by SCHOTT GLASWERKE in the German Federal Republic and designed for application to ultraviolet rays and when the thickness of the glass is 5 mm, the transmittance is 23% at a light wavelength of 280 nm. This transmittance is generally unacceptable.

Some optical materials of crystals, such as a crystalline composite of $TiF_2$, $CaF_2$, and Kcl, exhibit transmittances of around 80% at a light wavelength of approximately 200 nm. It is generally difficult to increase the sizes of such efficient optical materials to an acceptable range and to produce a good optical surface. The number of such efficient optical materials is limited, so that the degree of freedom in designing is small. Furthermore, if an optical system of the re-diffraction type is formed by using a limited number of lenses made of such efficient optical material while maintaining an acceptable numerical aperture NA, it is generally difficult to adequately compensate aberration. Therefore, it is also difficult to form an acceptable optical system by using only refracting members. Accordingly, in the conventional optical systems of FIGS. 1 and 2, if such efficient optical materials are used to form the lenses, the characteristics of processing are insufficient and accurate processing is usually difficult in ultraviolet and deep-ultraviolet region.

FIG. 3 shows a third conventional projection optical system, which is of the reflection type. In the optical system of FIG. 3, lights moved from an object O are reflected by mirrors 200 and 201 and form an image I with a magnification of unity (1/1) on a plane where the object O reside. The optical system of FIG. 3 constitutes a double telecentric system where principal rays on the object side and the image side are parallel to the optical axis.

Since the optical system of FIG. 3 is composed of the reflecting mirrors only, there is no limitation on the wavelength of used light. Since the mirrors 200 and 201 are concentric about a point P on the axis of the image I, the tangential astigmatism is large and the image surface is curved, although the spherical aberration, the coma, and the distortion are compensated appropriately. In the application of the optical system of FIG. 3 to a photolithography exposing a mask pattern on a semiconductor wafer, a slit is sometimes used to form an arcuate field at an image height where the tangential astigmatism and the sagittal astigmatism are equalized and the astigmatic difference is null, and the object O composed of the mask and the image surface I corresponding to the wafer are simultaneously scanned to produce a necessary projection field.

Figure 4:
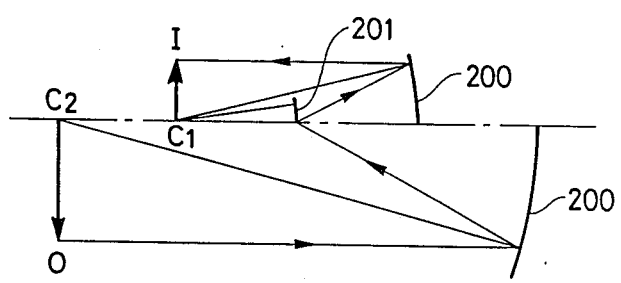
FIG. 4 is a diagram of the projection optical system of FIG. 3 in a supposed case where the system is used to produce a reduced image.

If the optical system of FIG. 4 is designed to produce a reduced image and maintain a telecentric structure, the mirrors 200 and 201 can not be concentric as shown in FIG. 4. In this case, if an upper portion of the mirror 200 and the mirror 201 are concentric about a point C1, the center C2 of a lower portion of the mirror 200 deviates from the point C1 so that the aberration is increased in a region outside the axis. Furthermore, since the object O and the image I can not reside on a common plane, it is necessary to scan the mask and the wafer independently and also to differentiate the scanning speeds in correspondence with the magnification. Since errors in the scanning speeds cause distortion of a projected image, it is necessary to precisely control the scanning speeds. As a projected image is finer, precise control of the scans is more difficult. Accordingly, if the optical system of FIG. 3 is used to produce a reduced image, there will be problems in respect of compensation for optical aberration and a mechanical structure.

FIG. 5 shows an objective in a conventional reflecting microscope. As shown in FIG. 5, a bundle of rays emitted from an object 301 to be projected are successively reflected by mirrors 305 and 306 and then form a reduced image on a plane 302 opposite the object 301.

Since the optical system of FIG. 5 is composed of the reflecting mirrors only, there is no limitation on the wavelength of used light. If the optical system of FIG. 5 forms a re-diffraction optical system under coherent illumination, 0-order diffracted light is blocked by the mirror 305 so that only +1-order diffracted light and −1-oder diffracted light are combined at the image or projection surface 302. As described clearly in "Optical and Electro-Optical Engineering Contact" Vol 23, No. 3, 1985, in this case, resulting interference fringes have a spatial frequency twice a desired spatial frequency so that it is difficult to project a fine pattern under coherent illumination.

Embodiments of this invention will now be described in the following with reference to the drawings.

FIG. 6 shows a projection optical system according to a first embodiment of this invention. The optical system of FIG. 6 includes a refraction sub-system X and a cata-dioptric sub-system Y.

The refraction sub-system X is generally composed of a convex lens 1, a concave lens 2, a convex lens 3, and a convex lens 4 made of quartz. An object 9 to be projected is placed on a focal plane F of the refraction sub-system X. The object 9 is illuminated by a light source (not shown). For example, the object 9 consists of a member formed with a pattern to be transferred to a semiconductor wafer. In the direction of movement of light, the concave lens 2 follows the convex lens 1, and the convex lens 3 succeeds the concave lens 2. Furthermore, the convex lens 4 follows the convex lens 3. The lenses 1–4, and the object 9 are supported by suitable members (not shown).

The cata-dioptric sub-system Y is placed opposite the object 9 with respect to the refraction sub-system X. The cata-dioptric sub system Y is generally composed of a phase compensating plate 5, a concave mirror 6, and a convex mirror 7 supported by suitable members (not shown). The phase compensating plate 5 is made of quartz. The concave mirror 6 has a central opening. The phase compensating plate 5 is the closest to the refraction sub-system X. The convex mirror 7 extends between the phase compensating plate 5 and the concave mirror 6. The phase compensating plate 5, the concave mirror 6, and the convex mirror 7 are arranged in rotation symmetry about a reference optical axis.

The refracting sub-system X and the cata-dioptric sub-system Y are optically connected. The sub-systems X and Y have a common axis and also a common entrance pupil E on the common axis and mutually oppose with a small clearance formed therebetween. Thus, the convex lens 4 and the phase compensating plate 5 opposed to each other are mutually separate by a small gap.

The concave mirror 6 and the convex mirror 7 are concentric about a point C of the entrance pupil E residing on an optical axis A. As viewed in FIG. 6, the left-hand side L of the convex lens 4, the right-hand side R of the phase compensating plate 5, and the concave mirror 6 are aspherical.

Lights moved from a point of the object 9 pass through the lenses 1, 2, 3, and 4 while undergoing refraction. After passing through the convex lens 4, the lights form parallel rays and enter the phase compensating plate 5. The lights pass through the phase compensating plate 5 and are then reflected toward the convex mirror 7, that is, toward the phase compensating plate 5, by the concave mirror 6. Thereafter, the lights are reflected away from the phase compensating plate 5 by the convex mirror 7 and then pass through the opening of the concave mirror 6, finally forming a projected image 8 at a plane extending perpendicular to the reference axis A and at the rear of the concave mirror 6. A semiconductor wafer is generally placed on this plane of the image 8.

It should be noted that FIG. 6 shows the case where the object 9 is illuminated by incoherent quasi-monochromatic lights.

The image magnification B in the embodiment of FIG. 6 will now be described with reference to FIG. 7.

The image magnification B is given by the following equation.

$$B = h2/h1 = (f2 \cdot \tan \theta 2)/(f1 \cdot \tan \theta 1)$$

where the character h1 denotes a height of the object 9; the character h2 denotes a height of the image 8; the character f1 denotes a focal length of the refraction sub-system X; the character f2 denotes a focal length of the cata-dioptric system Y; the character $\theta 1$ denotes an incident angle of the lights from the image height h1 with respect to a reference determined by the optical axis A; and the character $\theta 2$ denotes a discharge or final angle of the lights travelling to the image height h2.

Figure 7:
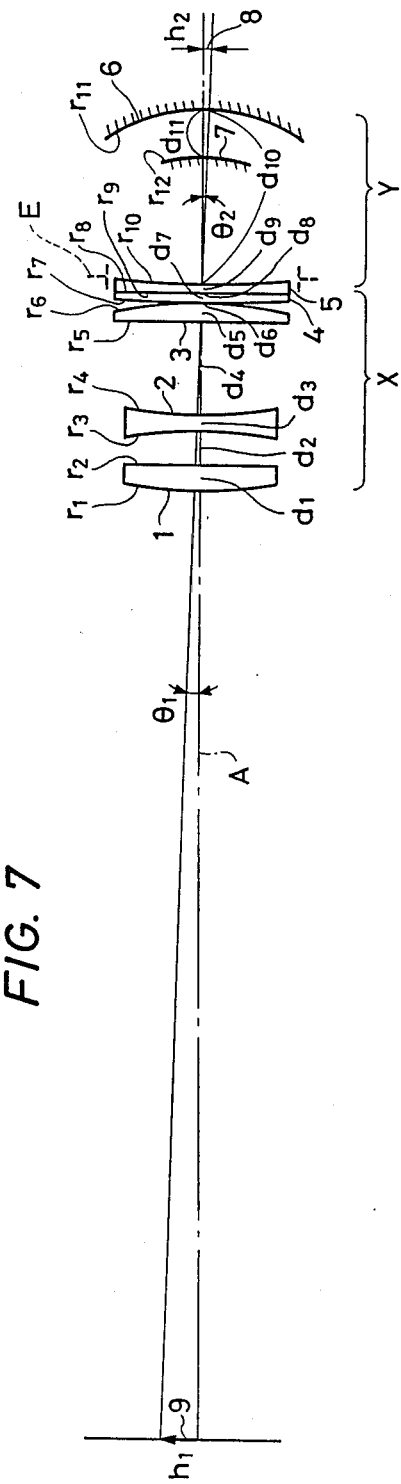
FIG. 7 is a diagram of the projection optical system of FIG. 6.

As viewed in FIGS. 6 and 7, the entrance pupil E extends at a right-hand vertex of the phase compensating plate 5. Furthermore, a rear principal point of the refraction sub-system X and a front principal point of the cata-dioptric sub-system Y are chosen to coincide with each other. Accordingly, the angles $\theta 1$ and $\theta 2$ are equal so that the magnification B is solely determined by the ratio between the focal lengths f1 and f2. In other words, the refraction sub-system X and the cata-dioptric sub-system Y have a common entrance pupil E and equal effecive diameters, so that the ratio between their numerical apertures determines the magnification B.

A bundle of the incident lights from the object 9 is converted by the refraction sub-system X into parallel rays before entering the cata-dioptric sub-system Y. Accordingly, the numerical aperture of a total optical system, which is composed of an optical combination of the refraction sub-system X and the cata-dioptric sub-system Y and which determines a resolution limit, is dependent on a projected image side composed of the cata-dioptric sub-system Y but is independent of an object side composed of the refraction sub-system X. Thus, a small numerical aperture of the refraction sub-system X is allowed so that it is possible to easily design and manufacture the refraction sub-system X. Furthermore, the object side refraction sub-system X serves as an afocal converter, enabling a small incident angle of the lights entering the image side cata-dioptric sub-system Y from the object 9 and thereby reducing optical aberrations in a range outside the optical axis.

In the cata-dioptric sub-system Y, since the concave mirror 6 and the convex mirror 7 are concentrical about the center C of the entrance pupil E, the coma, the astigmatism, and the distortion can be minimized.

The spherical aberration can be reduced or removed by the previously-mentioned aspherical structures of the phase compensating plate 5, the concave mirror 6, and the lens 4.

The compensation for the off-axis aberrations, that is, the coma, the astigmatism, and the distortion, in the object side refraction sub-system X is indenpendent of the compensation for the off-axis aberrations in the image side cata-dioptric sub-system Y, so that the aberrations can be small or null also in the optical combination of the sub-systems X and Y.

One exemplary specific design of the projection optical system of FIGS. 6 and 7 will now be described in the following.

The wavelengh of used light is 193 nm. The total system or optical combination of the refraction sub-system X and the cata-dioptric sub-system Y has a focal length f of 100 mm, an effective F number or aperture ratio of 1.3, and a magnification of 1/5.

The lenses 1–4, the phase compensating plate 5, and the mirrors 6 and 7 are designed as follows.

| | | |
|---|---|---|
| r1 = 232.659 | d1 = 13.027 | n1 = 1.560769 |
| r2 = −1307.074 | d2 = 17.669 | |
| r3 = −217.552 | d3 = 7.682 | n2 = 1.560769 |
| r4 = 222.203 | d4 = 48.397 | |
| r5 = 0 | d5 = 9.768 | n3 = 1.560769 |
| r6 = −209.132 | d6 = 0.163 | |
| r7 = 732.966 (aspherical) | d7 = 5.024 | n4 = 1.560769 |
| r8 = 0 | d8 = 0.8 | |
| r9 = 0 | d9 = 5.028 | n5 = 1.560769 |
| r10 = 0 (aspherical) | d10 = 90.426 | |
| r11 = −90.426 (aspherical) | d11 = −24.556 (reflecting surface) | |
| r12 = −65.869 (reflecting surface) | | | where, as shown in FIG. 7, the characters r1 and r2 denote the radiuses of curvature of the refracting surfaces of the lens 1; the characters r3 and r4 denote the radiuses of curvature of the refracting surfaces of the lens 2; the characters r5 and r6 denote the radiuses of curvature of the refracting surfaces of the lens 3; the characters r7 and r8 denote the radiuses of curvature of the refracting surfaces of the lens 4; the characters r9 and r10 denote the radiuses of curvature of the opposite surfaces of the phase compensating plate 5; the character r11 denotes the radius of curvature of the reflecting surface of the concave mirror 6; the character r12 denotes the radius of curvature of the reflecting surface of the convex mirror 7; the character d1 denotes the thickness of the lens 1; the character d2 denotes the distance between the rear surface of the lens 1 and the front surface of the lens 2; the character d3 denotes the thickness of the lens 2; the character d4 denotes the distance between the rear surface of the lens 2 and the front surface of the lens 3; the character d5 denotes the thickness of the lens 3; the character d6 denotes the distance between the rear surface of the lens 3 and the front surface of the lens 4; the character d7 denotes the thickness of the lens 4; the character d8 denotes the gap or clearance between the rear surface of the lens 4 and the front surface of the phase compensating plate 5; the character d9 denotes the thickness of the phase compensating plate 5; the character d10 denotes the distance between the rear surface of the phase compensating plate 5 and the reflecting surface of the concave mirror 6; the character d11 denotes the distance between the reflecting surface of the concave mirror 6 and the reflecting surface of the convex mirror 7; the character n1 denotes the refractive index of the lens 1; the character n2 denotes the refractive index of the lens 2; the character n3 denotes the refractive index of the lens 3; the character n4 denotes the refractive index of the lens 4; and the character n5 denotes the refractive index of the phase compensating plate 5. The radiuses r1–r12 and the thicknesses and distances d1–d11 are represented in unit of mm.

The aspherical sag quantity or deviation Z from a reference surface of the lens 4, the phase compensating plate 5, and the concave mirror 6 are represented by coefficients K, $A_4$, $A_6$, $A_8$, and $A_{10}$ in the following equation.

$$Z = (Rh^2/[1 + \sqrt{1 - (K + 1) R^2 h^2}]) + A_4 h^4 + A_6 h^6 + A_8 h^8 + A_{10} h^{10}$$

where $K = -e^2$; the character e denotes the eccentricity; the character h denotes the incident height of ray; $R = 1/r$; and the character r denotes the redius of curvature.

In respect of the aspherical surface (r7) of the lens 4, the coefficients K, $A_4$, $A_6$, $A_8$, and $A_{10}$ equal 0, $-1.4500 \times 10^{-8}$, $3.2000 \times 10^{-13}$, 0, and 0 respectively. In respect of the aspherical surface (r10) of the phase compensating plate 5, the coefficients K, $A_4$, $A_6$, $A_8$, and $A_{10}$ equal 0, $2.4233 \times 10^{-7}$, $2.2897 \times 10^{-11}$, $1.6851 \times 10^{-15}$, and $-1.3901 \times 10^{-19}$ respectively. In respect of the aspherical surface (r11) of the concave lens 6, the coefficients K, $A_4$, $A_6$, $A_8$, and $A_{10}$ equal 0, $1.9573 \times 10^{-9}$, $1.1446 \times 10^{-12}$, $2.3025 \times 10^{-16}$, and $-6.0020 \times 10^{-21}$ respectively.

FIG. 8(a), FIG. 8(b), and FIG. 8(c) show the spherical aberration, the astigmatism, and the distortion respectively in this specific design of the projection optical system of FIGS. 6 and 7.

Major components of the spherical aberration are removed by the aspherical surface of the quarz lens 4 and the phase compensating plate 5. The remaining high-oder components of the spherical aberration are reduced or compensated by the concave mirror 6.

The astigmatism, the distortion, and the coma are reduced or prevented by the following arrangement and structure. The concave mirror 6 and the convex mirror 7 in the cata-dioptric sub-system Y are concentric about the center C of the entrance pupil E. The reflecting surface of the convex mirror 7 is spherical. The convex mirror 7 is concentric with the concave mirror 6 even in respect of lights traveling off the axis.

In the embodiment of FIGS. 6–8, the refracting members or lenses are made of quartz only, so that the transmittance is generally equal to or higher than 30% for a light having a wavelength of 193 nm.

In the embodiment of FIGS. 6–8, the refracting sub-system X has a large F number or a large aperture ratio so that the aberrations of the sub-system X can be easily compensated. As described previously, the cata-dioptric sub-system Y is designed so that the related aberrations can be small or null. Furthermore, since the refraction sub-system X and the cata-dioptric sub-system Y are optically and coaxially connected and the phase compensating plate is placed in an end region of the cata-dioptric sub-system Y adjoining the refraction sub-system X, the spherical aberration, the coma, the astigmatism, and the distortion can be small or null.

In addition, since a large part of the total refraction power is owed to the reflecting mirrors 6 and 7 and the lenses 1–4 are made of quartz only, an acceptable transmittance can be ensured for lights in ultraviolet and deep-ultraviolet ranges.

Figure 9:
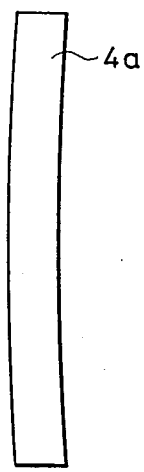
FIG. 9 is a sectional view of a phase compensating plate in a projection optical system according to a second embodiment of this invention.

FIG. 9 shows a second embodiment of this invention, which is similar to the embodiment of FIGS. 6–8 except for the following design change. As shown in FIG. 9, this embodiment includes a phase compensating plate 4a. This phase compensating plate 4a serves as a lens 4

(see FIG. 6) and also as a phase compensating plate 5 (see FIG. 6). Specifically, the lens 4 and the phase compensating plate 5 are integrally connected to form another compensating plate 4a. This compensating plate 4a is thus common to both the refraction sub-system X and the cata-dioptric sub-system Y (see FIG. 6).

Figure 10:
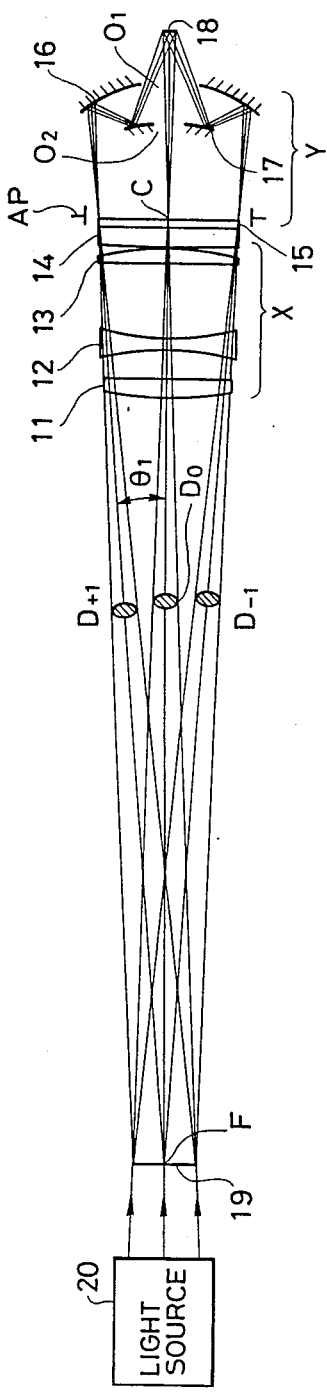
FIG. 10 is a sectional view of a projection optical system according to a third embodiment of this invention.
Figure 11:
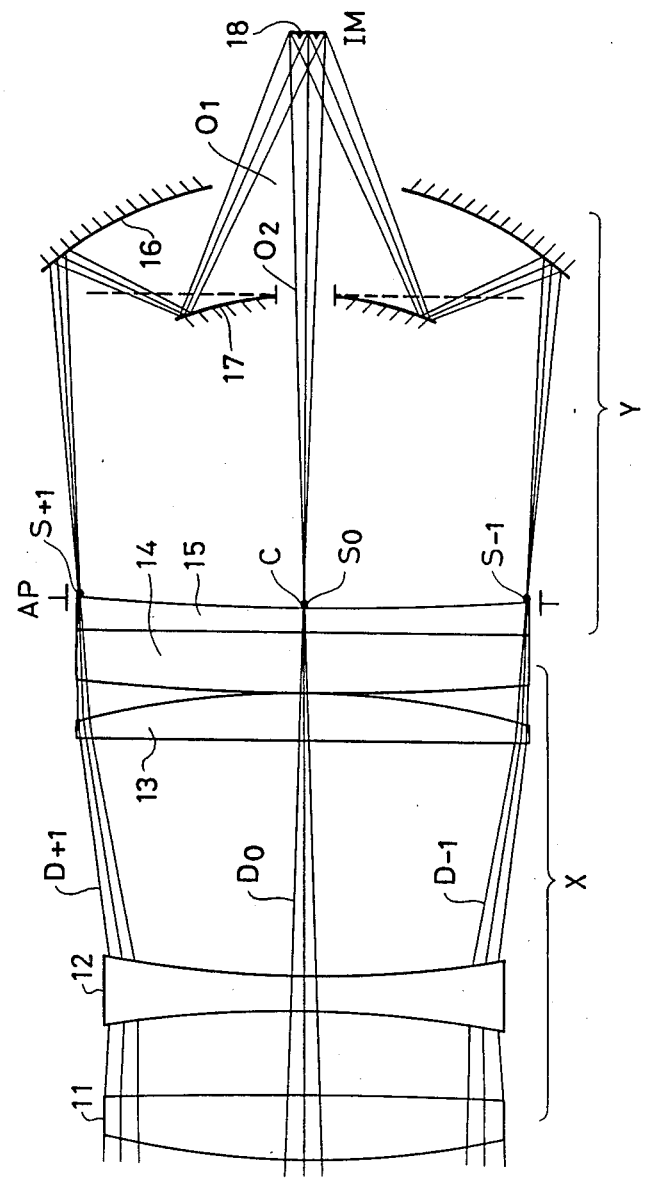
FIG. 11 is an enlarged view of part of the projection optical system of FIG. 10.

FIGS. 10 and 11 show a projection optical system according to a third embodiment of this invention. The optical system of FIGS. 10 and 11 includes an object side refraction sub-system X and an image side cata-dioptric sub-system Y.

The refraction sub-system X is generally composed of a convex lens 11, a concave lens 12, a convex lens 13, and a convex lens 14 made of quartz. An object 19 to be projected is placed on a focal plane F of the refraction sub-system X. The object 19 is illuminated by a light source 20. For example, the object 19 consists of a member formed with a pattern to be transferred to a semiconductor wafer. In the direction of movement of light, the concave lens 12 follows the convex lens 11, and the convex lens 13 succeeds the concave lens 12. Furthermore, the convex lens 14 follows the convex lens 13. The lenses 11–14, and the object 19 are supported by suitable members (not shown).

The cata-dioptric sub-system Y is placed opposite the object 19 with respect to the refraction sub-system X. The cata-dioptric sub-system Y is generally composed of a phase compensating plate 15, a concave mirror 16, and a convex mirror 17 supported by suitable members (not shown). The phase compensating plate 15 is made of quarz. The concave mirror 16 has a central opening O1. The convex mirror 17 has a central opening O2. The phase compensating plate 15 is the closest to the refraction sub-system X. The convex mirror 17 extends between the phase compensating plate 15 and the concave mirror 16.

The refracting sub-system X and the cata-dioptric sub-system Y are opposed and optically connected. The sub-systems X and Y have a common axis. On this common axis, the position of a diaphragm or pupil AP of each of the sub-systems X and Y coincides with the position of the center C of curvature of the phase compensating plate 15.

The phase compensating plate 15 is of rotation symmetry about the common axis or the reference optical axis. The concave mirror 16 and the convex mirror 17 are concentric about the center C of curvature of the phase compensating plate 15.

In the embodiment of FIGS. 10 and 11, the numerical aperture of the object side or the refraction sub-system X is preferably 0.076 and the numerical aperture of the image side or the cata-dioptric sub-system Y is preferably 0.38, and the magnification is preferably 1/5.

The light source 20 emits coherent rays applied to the entire area of the object 19. The emitted lights are composed of convergent rays. Specifically, after the lights pass through the refraction sub-system X, they converge on the center C of curvature of the phase compensating plate 15. In this way, the object 19 is illuminated by coherent and convergent rays emitted from the light source 20.

0-order diffracted light D0, +1-order diffracted light D+1, −1-order diffracted light D−1, and the higher-order diffracted lights are discharged from the object 19. A portion of these lights enter the optical combination of the sub-systems X and Y. Specifically, the incident angle which depends on the numerical aperture at the objection side of the optical combination of the sub-systems X and Y is chosen to correspond to the angle $\theta_1$ of the +1-order diffracted light D+1 or the −1-order diffracted light D−1, so that +2-order diffracted light, −2-order diffracted light, and the higher-order diffracted lights will not enter the optical combination of the sub-system X and Y. In this way, only the 0-order diffracted light D0, the +1-order diffracted light D+1, and the −1-order diffracted light D−1 enter the optical combination of the sub-systems X and Y.

The 0-order diffracted light D0, the +1-order diffracted light D+1, and the −1-order diffracted light D−1 from the object 19 pass through the lenses 11–14 and the phase compensating plate 15 while undergoing refraction. Then, the 0-order diffracted light D0, the +1-order diffracted light D+1, and the −1-order diffracted light D−1 separate and converge respectively on point spectrums S0, S+1, and S−1 in the diaphragm or pupil AP. After passing through the diaphragm or pupil AP, the +1-order diffracted light D+1 and the −1-order diffracted light D−1 are reflected toward the phase compensating plate 15 or the convex mirror 17 by the concave mirror 16 and are then reflected away from the phase compensating plate 15 by the convex mirror 17. After reflected by the convex mirror 17, the +1-order diffracted light D+1 and the −1-order diffracted light D−1 pass throught the central opening O1 of the concave mirror 16 and move into the rear of the concave mirror 16. After passing through the diaphragm or pupil AP, the 0-order diffracted light D0 successively passes through the central opening O2 of the convex mirror 17 and the central opening O1 of the concave mirror 16 and then moves into the rear of the concave mirror 16.

Figure 12:
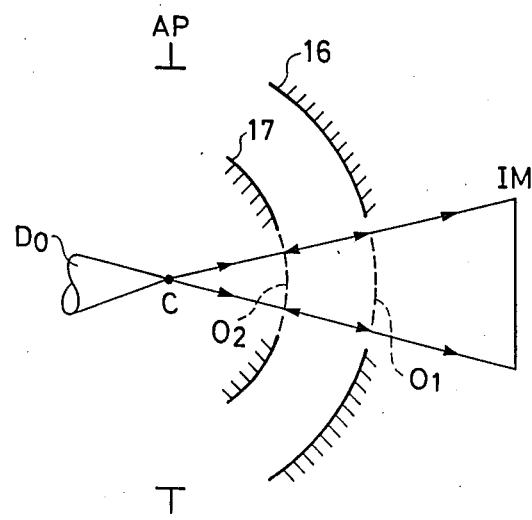
FIG. 12 is a diagram of part of the projection optical system of FIGS. 10 and 11.

As best shown in FIG. 12, since the concave mirror 16 and the convex mirror 17 are concentrical about the center C of the diaphragm or pupil AP and the 0-order diffracted light D0 concentrates on this point C, the 0-order diffracted light D0 travels along a path similar to a supposed path along which the 0-order diffracted light D0 travels if the light D0 is reflected by the mirrors 16 and 17. Accordingly, the travel of the 0-order diffracted light D0 through the mirrors 16 and 17 without reflection does not increase the optical aberrations.

At the rear of the concave mirror 16, the 0-order diffracted light D0, the +1-order diffracted light D+1, and the −1-order diffracted light D−1 meet, forming interference fringes which define an image on a plane IM perpendicular to the reference optical axis. A semiconductor wafer is generally placed at this plane IM.

As described previously, the cata-dioptric reflecting sub-system Y has a relatively large numerical aperture, while the refraction sub-system X has a relatively small numerical aperture. The lenses 11–14, and the phase compensating plate 15 are made of quartz only. The total number of the lenses and the phase compensating plate is five. Accordingly, the transmittance of the projection optical system of FIGS. 10–12 is equal to or higher than 30% for light having a wavelength of 200 nm.

In the embodiment of FIGS. 10–12, the refraction sub-system X and the cata-dioptric sub-system Y are optically connected. The sub-systems X and Y have a common axis. The center of curvature of the image side of the phase compensating plate 15 coincides with the position of the diaphragm or pupil AP. The object 19 to be projected is illuminated by coherent rays in such a manner that the coherent rays concentrate on the center of the diaphragm or pupil AP after they pass through the object 19. The projection optical system of FIGS. 10–12 includes a re-diffraction arrangement which forms an image by interference fringes of 0-order diffracted light, +1-order diffracted light, and −1-order diffracted light. The re-diffraction arrangement enables the projection of a fine pattern. In addition, since a large part of the total refraction power is owed to the reflecting mirrors 16 and 17 and the number of the refracting lenses is small, an acceptable transmittance can be ensured for lights in ultraviolet and deep-ultraviolet ranges and a high resolution can be produced.

What is claimed is:

1. A projection optical system comprising:
   (a) a refraction sub-system which includes refracting members; and
   (b) a cata-dioptric sub-system which includes a phase compensating member, a convex mirror, and a concave mirror arranged in rotation symmetry about a reference axis, the concave mirror having a central opening, the cata-dioptric sub-system being optically connected to the refraction sub-system;
   (c) wherein the refraction sub-system extends at an object side and the cata-dioptric sub-system extends at an image side; the refraction sub-system and the cata-dioptric sub-system have a common axis and a common entrance pupil on the common axis; a rear principal point of the refraction sub-system essentially coincides with a front principal point of the cata-dioptric sub-system; the phase compensating member adjoins the refraction sub-system; the concave mirror reflects at least part of light which passed through the phase compensating member toward the convex mirror; the convex mirror reflects said reflected light; the central opening of the concave mirror allows said light reflected by the convex mirror to pass through the concave mirror; and the optical combination of the refraction sub-system and the cata-dioptric sub-system is operative to allow the light to form an image on a plane extending perpendicular to the reference axis and at a rear of the concave mirror.

2. The projection optical system of claim 1 wherein the the convex mirror reflects the entire light reflected by the concave mirror.

3. The projection optical system of claim 1 wherein the refracting member adjoining the cata-dioptric sub-system has a surface opposing the cata-dioptric sub-system, a curvature of said opposing surface of the refracting member is zero, the phase compensating member has a surface opposing the refraction sub-system, a curvature of said opposing surface of the phase compensating member is zero, and the opposing surface of the refracting member and the opposing surface of the phase compensating member are coaxially arranged with a small clearance formed therebetween.

4. The projection optical system of claim 1 wherein the phase compensating member is integral with the refracting member adjoining the cata-dioptric sub-system.

5. The projection optical system of claim 1 wherein a ratio between numerical apertures of the refraction sub-system and the cata-dioptric sub-system determines a magnification.

6. A projection optical system comprising:
   (a) a refraction sub-system which includes refracting members;
   (b) a cata-dioptric sub-system which includes a phase compensating member, a convex mirror, and a concave mirror, the phase compensating member being arranged in rotation symmetry about a reference axis, the convex mirror and the concave mirror being concentric about a center of curvature of the phase compensating member, the convex mirror having a central opening, the concave mirror having a central opening, the cata-dioptric sub-system being optically connected to the refraction sub-system;
   (c) wherein the refraction sub-system extends at an object side and the cata-dioptric sub-system extends at an image side; the refraction sub-system and the cata-dioptric sub-system have a common axis; the phase compensating member adjoins the refraction sub-system; a diaphragm position resides on a surface of the phase compensating member at an image side; the refraction sub-system refracts light moved from an object and allows the refracted light to pass through the phase compensating member; the central opening of the convex mirror and the central opening of the concave mirror allow part of the light which passed through the phase compensating member to travel through the convex mirror and the concave mirror and to reach an image point; the concave mirror reflects remaining part of the light toward the convex mirror; the convex mirror reflects said reflected light; the central opening of the concave mirror allows the light reflected by the convex mirror to travel through the concave mirror and to reach the image point; and the light reaching the image point forms an image on a plane extending perpendicular to the reference axis and at a rear of the concave mirror;
   (d) an object to be projected which extends on an object side focal surface of the refraction sub-system, the object being formed with a pattern having a preset spatial frequency chosen to produce diffracted light from coherent illumination; and
   (e) a light souce emitting convergent coherent light and applying the convergent coherent light to the object, the light souce being operative to concentrate the convergent light on the center of curvature of the phase compensating member after the convergent light passes through the object.

7. The projection optical system of claim 6 wherein the refraction sub-system has a numerical aperture smaller than a numerical aperture of the cata-dioptric sub-system.

* * * * *